United States Patent [19]

Fujii et al.

[11] Patent Number: 4,785,335

[45] Date of Patent: Nov. 15, 1988

[54] METHOD OF PRINTING THROUGH CONTACT EXPOSURE IN STEP-AND-REPEAT MACHINE

[75] Inventors: Koichi Fujii; Masaji Mizuta, both of Kyoto, Japan

[73] Assignee: Dainippon Screen Mfg. Co., Ltd., Kyoto, Japan

[21] Appl. No.: 96,496

[22] Filed: Sep. 15, 1987

[30] Foreign Application Priority Data

Sep. 16, 1986 [JP] Japan .................. 61-219014

[51] Int. Cl.⁴ .................. G03B 27/02; G03B 27/04
[52] U.S. Cl. .................. 355/132; 355/95
[58] Field of Search .................. 355/95, 132, 78, 99, 355/118

[56] References Cited

U.S. PATENT DOCUMENTS

| | | | |
|---|---|---|---|
| 3,904,291 | 9/1975 | Webster | 355/95 X |
| 4,201,581 | 5/1980 | Thomas et al. | 355/91 X |
| 4,204,736 | 5/1980 | Hamada et al. | 355/118 |
| 4,360,266 | 11/1982 | Takeuchi | 355/132 X |

Primary Examiner—Donald A. Griffin
Attorney, Agent, or Firm—Lowe, Price, LeBlanc, Becker & Shur

[57] ABSTRACT

Disclosed is a method of printing through a contact exposure in a step-and-repeat machine which is constituted by a photosensitive material holder for supporting a photosensitive material, an original film holder having a transparent base plate for fixedly holding an original film and having a holder frame defining a first chamber between the photosensitive material holder and the base plate, first suction means for holding the original film on the base plate, second suction means for evacuating air within the first chamber, and a light source disposed behind the original film for exposing the photosensitive material through the original film. The method comprises the steps of: actuating the first suction means to mount the original film fixedly on the base plate of the original holder by means of suction: positioning the original holder at a desired position on the photosensitive material; actuating the second suction means to evacuate air within the first chamber; decreasing the suction applied from the first suction means so as to effect the higher negative pressure within the first chamber than that applied by the first suction means, by which the original film contacts with the photosensitive material; and exposing the photosensitive material through the original film.

8 Claims, 3 Drawing Sheets

METHOD OF PRINTING THROUGH CONTACT EXPOSURE IN STEP-AND-REPEAT MACHINE

BACKGROUND OF THE INVENTION

1. Field of the Invention

The present invention relates to a step-and-repeat machine for use in photoengraving work, and particularly relates to a method of printing through a contact exposure in a step-and-repeat machine in which an original film and a photo-sensitive material are made to be in contact with each other by a vacuum.

2. Description of the Prior Art

A step-and-repeat machine is an apparatus for photocomposing a picture of an original film onto a photosensitive material such as a presensitized plate or the like. The photocomposing in the step-and-repeat machine is carried out through such a process that an original holder having a light-transmissible plate such as a glass plate for suction-holding an original film on the lower surface thereofis moved to one desired position or more on a photosensitive material mounted on a photosensitive material holder, the original film and the photosensitive material are made to abut each other at the above-mentioned desired position at the same time air is evacuated out of a space enclosed by the light-transmissible plate of the original holder. The photosensitive material (or the photosensitive material holder) and airtight packing are provided along the periphery of the light-transmissible plate at its circumference so that the original film and the photosensitive material are made to come into close contact with each other by a vacuum. Then, a light source provided behind the original film is turned on so that the picture of the original film is printed on the photosensitive material.

In the step-and-repeat machine described above, however, a phenomenon of vagueness often occurs in a printed picture particularly in the case where printing is carried out at a position where the light-transmissible plate for vacuum-holding the original film on the original holder is in the state of mounting over an end of the photosensitive material. This is because the photosensitive material, such as a presensitized plate or the like, is made by applying a photosensitizer onto a surface of an aluminum plate, and therefore the light-transmissible plate may be curved owing to the thickness of the aluminum plate or the like when the original film is placed into vacuum-contact with the photosensitive material so that the original film being vacuum-held by the light-transmissible plate is made to curve similarly to the curve of the light-transmissible plate to thereby cause a phenomenon that the original film and the photosensitive material do not completely come into close contact with each other over all the area of the original film. Further, in the case where a lamination of a plurality of films is used as the original film, such a phenomenon as described above often occurs owing to the thickness of the lamination of films.

In order to solve the disadvantages described above, Japanese Patent Unexamined Publication No. 56-38036 discloses a step-and-repeat machine in which a surface of a photosensitive holder for holding a photosensitive material is made of a flexible material such as a flexible metal plate or the like and an air-flowing portion is provided for exposing the back surface of the flexible plate to the air, so that the flexible plate is made to curve along the photosensitive material when the original film is made into vacuum-contact with the photosensitive material.

In the step-and-repeat machine disclosed in the above Japanese Paten Unexamined Publication No. 56-38036, however, in the case where a relatively hard material such as a relatively hard metal plate is used as the flexible plate, the thickness of the photosensitive material cannot be completely accommodated by the flexible plate, so that a phenomenon of vagueness in print cannot be eliminated particularly in the vicinity of a step portion owing to the thickness of the photosensitive material or the like. Accordingly, it is considered that a soft material such as a plate of soft vinyl chloride or the like is used as the flexible plate. Even in that case, not only the vagueness phenomenon can not be completely eliminated, but there is a further problem that a mark of the end portion of the photosensitive material is left on the surface of the soft material in the vacuum contact so that the life of the soft material is made short.

SUMMARY OF THE INVENTION

It is therefore an object of the present invention to eliminate the drawbacks in the prior art as described above.

It is another object of the present invention to provide a method of printing through a contact exposure in a step-and-repeat machine in which an original film and a photo-sensitive material are made to be in completely close contact with each other by a vacuum so as not to cause vagueness in printed picture due to incomplete close contact.

In order to attain the above objects, according to the present invention, the method of printing through a contact exposure in a step-and-repeat machine including a photosensitive material holder on which a photosensitive material is supported, an original film holder having a transparent base plate on which an original film is fixedly held and a holder frame defining a first chamber between the photosensitive material holder and the base plate, first suction means for holding the original film on the base plate, second suction means for evacuating air within the first chamber and a light source disposed behind the original film for exposing the photosensitive material through the original film, comprises the steps of:

(i) actuating the first suction means to mount the original film fixedly on the base plate of the original holder by means of suction;
(ii) positioning the original holder at a desired position on the photosensitive material;
(iii) actuating the second suction means to evacuate air within the first chamber;
(iv) decreasing the suction applied from the first suction means so as to effect the higher negative pressure within the first chamber than that applied by the first suction means, by which the original film contacts with the photosensitive material; and
(v) exposing the photosensitive material through the original film.

As the degree of vacuum for the suction-holding of the original film on the original holder is lowered, the original film which has been in close contact with the light-transmissible plate and which has been in incomplete close-contact with the photosensitive material at a portion, comes into completely close contact with the photosensitive material even at that portion. The step of decreasing the degree of vacuum is carried out in the duration where the original film and the photo-sensitive material are in complete close-contact with each other and printing is not carried out, there is no possibility of occurrence of any displacement of the photosensitive material.

DETAILED DESCRIPTION OF PREFERRED EMBODIMENT

Figure 1:
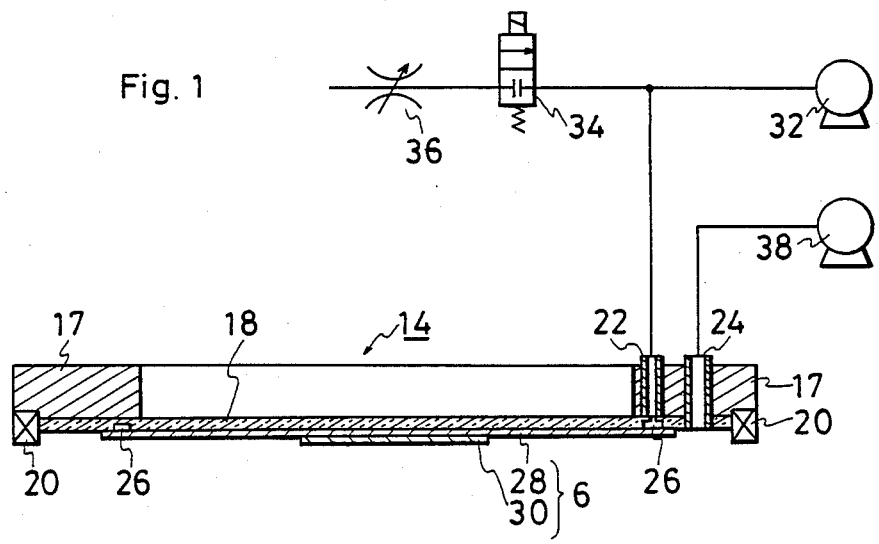
FIG. 1 is a perspective view of a step-and-repeat machine to which the present invention is applied.

Referring to the drawings, an embodiment of the present invention will be described hereunder.

FIG. 1 is a perspective view showing a slanting type step-and-repeat machine to which the present invention is applied.

In FIG. 1, the step-and-repeat machine is provided with a table 1 which is constituted by a photosensitive material holder 2 for positioning and mounting a photosensitive material 4 such as a presensitized plate or the like, a supply portion 8 for feeding a transparent sheet or original film 6, and a discharge portion 10 for discharging the original film 6. The supply and discharge portions 8 and 10 are provided on the side of the photosensitive material holder 2. A carriage 12 is provided with a light source 16 and an original holder 14 for suction-holding the original film 6 at the lower surface thereof. The carriage 12 is arranged so as to be movable upward/downward in the drawing along a frame 15 which is arranged also to be movable leftward/rightward in the drawing, so that the original holder 14 can be made to face a desired position on the table 1.

In the thus arranged apparatus, photocomposing is carried out in such a manner that the frame 15 and the carriage 12 are moved so as to cause the original holder 14 mounted on the carriage 12 to move to a position where the original holder 14 is in opposition to the supply portion 8, the original film 6 on the support portion 8 is made to be suction-held by the original holder 14 at the lower portion thereof, the original holder 14 is moved to a desired position on the photosensitive material 4, and then the light surface 16 is turned on to carry out printing under the condition that the original film 6 and the photosensitive material 4 are kept in close contact with each other by means of a vacuum. This printing operation is carried out successively at each of the desired positions of the original film 6. Upon completion of printing at all the desired positions of the original film 6 suction-held by the original holder 14, the original holder 14 is moved to a position in opposition to the discharge portion 10, where the original film 6 which has been suction-held by the original holder 14 is discharged into the discharge portion 10.

Figure 2:
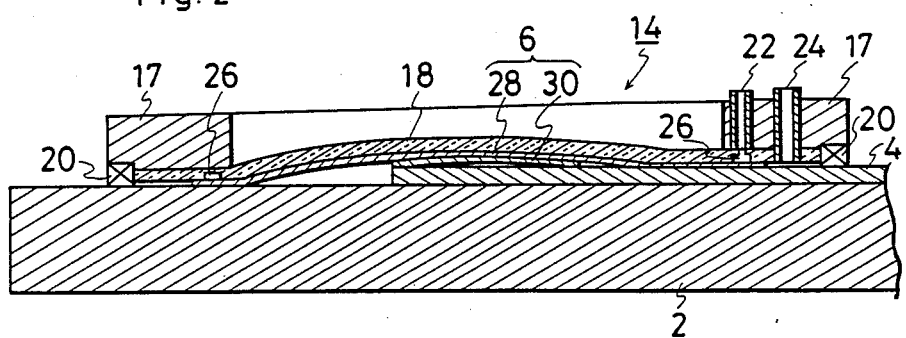
FIG. 2 is a schematic view showing an original holder and an air-pressure circuit for realizing the present invention.
Figure 3:
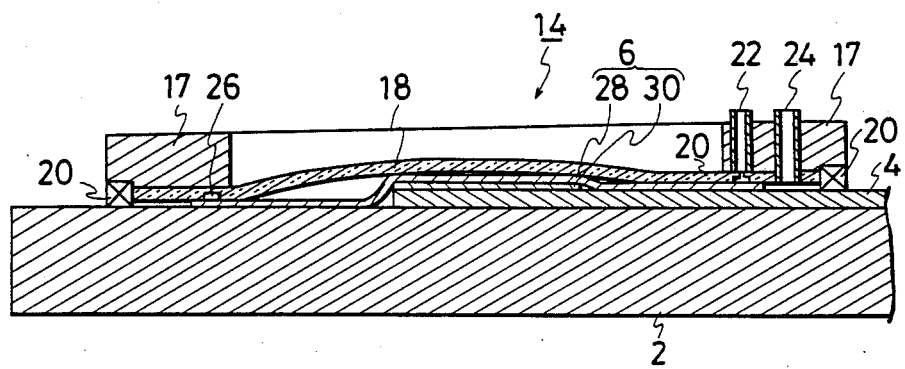
FIGS. 3 and 4 are cross-sections showing the main part of an original film and a photo-sensitive material in different vacuum close contact state.
Figure 4:
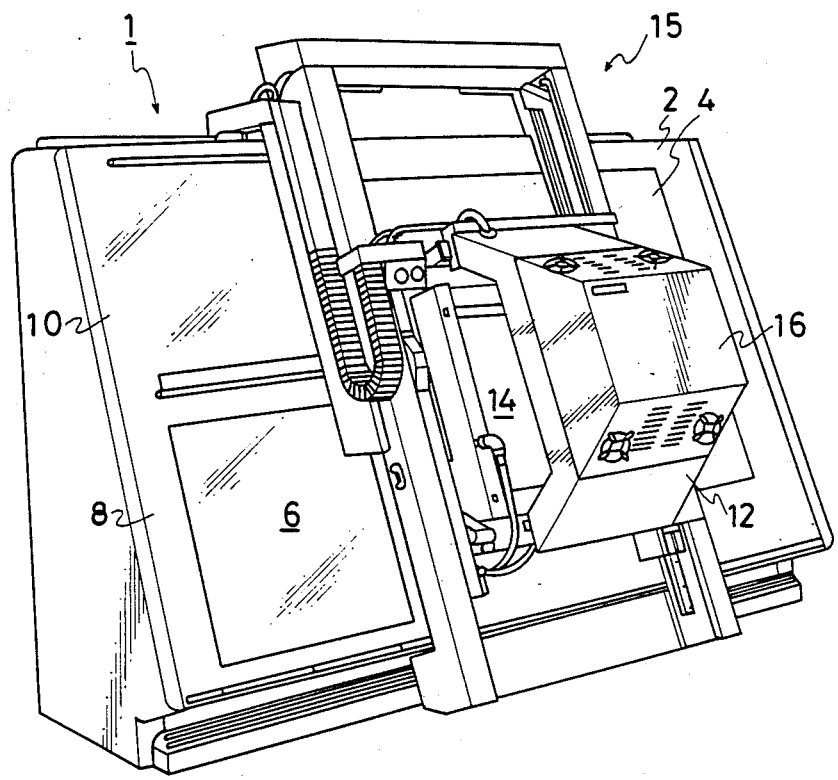

Referring to FIGS. 2 through 4, the present invention will be described more in detail.

In FIG. 2, the above-mentioned original holder 14 is constituted by a light-transmissible plate 18 such as a glass plate or the like attached on the lower surface of a frame body 17, airtight rubber packing 20 provided around the periphery of the light-transmissible plate 18, a pipe 22 for sucking the original film 6, and another pipe 24 for sucking air to make the original film and the photosensitive material come into close contact with each other by a vacuum.

A sucking groove 26 communicated with the pipe 22 for sucking the original film 6 is formed in the lower surface of the light-transmissible plate 18 so as to surround an opening portion of the frame 17. In the drawing, means for selectively changing over the path of air to the vacuum close-contacting pipe 24 and the sucking pipe 22 is omitted to be illustrated. As is apparent in FIG. 2, the original film 6 is constituted by a transparent sheet 28 and an original positive or negative 30 stuck on the sheet 28 by means of a transparent adhesive tape. The transparent sheet 28 is used for the purpose that a fixed size may be given to the original film to be held on the transparent plate 18.

Sometimes the original positive or negative 30 may be used together with the transparent subsidiary sheet 28 described above, and at other times the original positive or negative 30 may be singly used without using the transparent subsidiary sheet 28. Accordingly, the term "original film 6" is used in the present specification to represent not only the original positive or negative 30 together with the transparent subsidiary sheet 28 in the former case but the original positive or negative 30 alone in the latter case.

In FIG. 2, there are provided a vacuum pump 32, a leak valve 36, and a vacuum pump 38. The vacuum pump 32 is connected to the sucking pipe 22 for sucking the original film 6 and to an electromagnetic valve 34. The leak valve 36 has one side connected to the electromagnetic valve 34 and the other side opened to the air. The vacuum pump 38 is connected to the sucking pipe 24 for making vacuum close-contact between the original film 6 and the photosensitive material 4.

The vacuum close-contacting operation will be now described hereunder.

First, the original holder 14 is moved to a position where the original holder 14 faces the supply portion 8, and the vacuum pump 32 is actuated to suck and hold the original film 6 on the lower surface of the light-transmissible plate 18 as shown in FIG. 2. At that time, the degree of vacuum for suction-holding the original film 6 by the vacuum pump 32 is required to be a relatively high value so as not to generate any displacement of the original film 6 during movement of the original holder 14. In that condition, the original holder 14 is moved to a desired position on the photosensitive material 4 as described above and in this desired position the photosensitive material 4 or the photosensitive material holder 2 is made to come into contact with the packing 20 of the original holder 14.

Next, the vacuum pump 38 is actuated to evacuate the air within a space between the light-transmissible plate 18 and the photosensitive material holder 2 so that the original film 6 and the photosensitive material 4 are made to come into close contact with each other by a vacuum. At that time, in the case where the light-transmissible plate 18 is spread over one and of the photosensitive material 4, thelight-transmissible plate 18 is curved owing to the thickness of the photosensitive material 4, so that the original film 6 and the photosensitive material 4 cannot be in complete close-contact as shown in FIG. 3.

In that condition, the electromagnetic valve 34 is changed over from the state shown in FIG. 2 so as to connect the air pressure circuit communicated with the sucking groove 26 to the air through the leak valve 36, so that the degree of vacuum for sucking the original film 6 by means of the sucking groove 26 is lowered. Then, the degree of vacuum applied to the original film 6 on the photosensitive material 4 side becomes relatively high, so that the original film 6 is made to come into complete close-contact with the photosensitive material 4 as shown in FIG. 4. In that time, the end portion of the original film 6 is still completely fixed by the vacuum contact operation by the vacuum pump 38 as well as by the suction-holding operation by the sucking groove 26 although the suction holding force by the latter is lowered, so that no displacement of the original film 6 is generated.

Under that condition, the light source 16 is turned on to print a picture of the original film 6 onto the photosensitive material 4.

Upon completion of the print, the electromagnetic valve 34 is changed-over into the state shown in FIG. 2 so that the degree of vacuum for suction-holding the original film 6 by means of the vacuum pump 32 is returned to the initial value, whereby the original film 6 is completely suction-held onto the light-transmissible plate 18 again. The initial value of the degree of vacuum may be higher than the lowered value of the degree of vacuum degree as described above. Succeedingly, the operation of the vacuum pump 38 is stopped and simultaneously the pipe 24 is opened to the air, so that the close contact between the original film 6 and the photosensitive material 4 is released.

Figure 5:
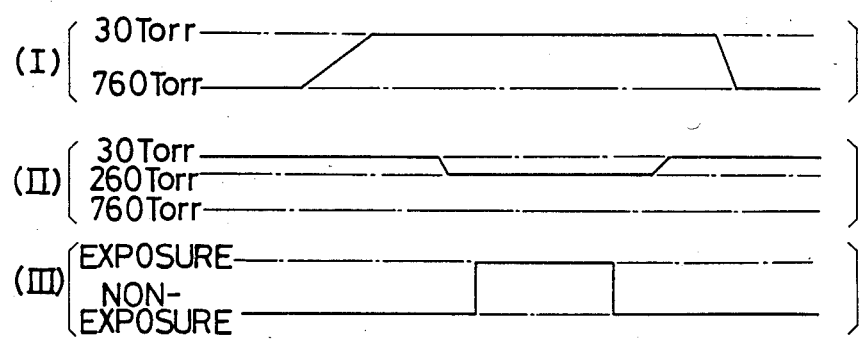
FIG. 5 is a time-chart showing suction changing-over and printing operation.

FIG. 5 is a time-chart showing the operations described above. In the drawing, the diagram (I) shows the change of the degree of vacuum for making the vacuum close contact between the original film 6 and the photosensitive material 4 by means of the pipe 24, the diagram (II) shows the change of the degree of vacuum for suction-holding the original film 6 by the sucking groove 24, and the diagram (III) shows the on-off state of the light source 16.

The degree of vacuum for sucking the original film 6 in printing as described above may have any value so long as it is selected to be lower than the value of the degree of vacuum for making the vacuum close-contact by means of the vacuum pump 38. The degree of vacuum for sucking the original film 6 may be established at a suitable value by adjusting the leak valve 36 in accordance with the kind or the like of the step-and-repeat machine. If the degree of vacuum for sucking the original film 6 is too low, however, air leaks from the light-transmissible plate 18 side toward the photosensitive material 4 side, so that it not only becomes impossible to raise the degree of vacuum for making the vacuum close-contact to a value necessary for the close contact but there occurs a possiblity that the original film 6 is displaced from the position where the original film 6 is initially held. If the degree of vacuum for sucking the original film 6 is too high, on the contrary, it is impossible to sufficiently obtain the effect according to the present invention. Accordingly, the lowered value of the degree of vacuum for sucking the original film 6 is preferably selected to be within a range of from 160 Torr to 460 Torr. As a result of experiments on original films in the generally most treating state, a sufficient effect could be obtained when the above-mentioned the degree of vacuum was selected to be a value of 260 Torr as shown in FIG. 5.

The method of printing through a contact exposure in a step-and-repeat machine according to the present invention is arranged in such a manner as described above. Accordingly, it is possible to make the original film be in complete close-contact with the photosensitive material without causing any displacement of the original film, and therefore it is possible to completely prevent vague print of a picture of the original film from occurring. Further, it is not necessary to use a soft material apt to be deteriorated as a material for forming the surface of the photosensitive holder.

What is claimed is:

1. A method of printing through a contact exposure in a step-and-repeat machine, said machine including a photosensitive material holder on which a photosensitive material is supported, an original film holder having a transparent base plate on which an original film is fixedly held and a holder frame defining a first chamber between the photosensitive material holder and the base plate, first suction means for holding the original film on the base plate, second suction means for evacuating air within the first chamber and a light source disposed behind the original film for exposing the photosensitive material through the original film, said method comprising the steps of:
    (i) actuating the first suction means to mount the original film fixedly on the base plate of the original holder by means of suction;
    (ii) positioning the original holder at a desired position ont he photosensitive material;
    (iii) actuating the second suction means to evacuate air within the first chamber;
    (iv) decreasing the suction applied from the first suction means so as to effect the higher negative pressure within the first chamber than that applied by the first suction means, by which the original film contacts with the photosensitive material; and
    (v) exposing the photosensitive material through the original film.

2. A method set forth in claim, after the exposing step (v) further comprising:
    (vii) increasing the suction applied from the first suction means so as to fixedly hold the original film thereon;
    (viii) releasing the suction applied from the second suction means; and
    (ix) repeating the steps (ii) through (viii), whereby a desired photocomposing is carried out on the photosensitive material.

3. A method set forth in claim 1, wherein the step of decreasing the suction is effected by leaking the suction in a line between the first suction means and the original film.

4. A method set forth in claim 1, wherein the original film holder further defines a groove extending the periphery thereof, said groove being connected to said first suction means so as to hold the original film effectively on the film holder when the first suction means is actuated.

5. A method set forth is claim 1, wherein the step of positioning the original holder is carried out at the marginal portion of the photosensitive material.

6. A method set forth in claim 1, wherein during the step of actuating the first suction means, a vacuum degree applied to the original film attains to apporximately 30 Torr.

7. A method set forth in claim 1, wherein, during the step of decreasing the suction, a vacuum degree applied to the original film is substantially in the range of 160 Torr to 460 Torr.

8. A method set forth in claim 2, wherein, during the step of increasing the suction, a vacuum degree applied to the original film attains the same degree as in the step of actuating the first suction means or more.

* * * * *